United States Patent [19]
Wang et al.

[11] Patent Number: 5,943,590
[45] Date of Patent: Aug. 24, 1999

[54] METHOD FOR IMPROVING THE PLANARITY OF SHALLOW TRENCH ISOLATION

[75] Inventors: Jyh-Lih Wang; Yung-Shun Chen, both of Hsinchu, Taiwan

[73] Assignee: Winbond Electronics Corp., Hsinchu, Taiwan

[21] Appl. No.: 08/929,706

[22] Filed: Sep. 15, 1997

[51] Int. Cl.⁶ .................................................. H01L 21/76
[52] U.S. Cl. ........................ 438/427; 438/424; 438/435; 438/437; 148/DIG. 50
[58] Field of Search .................................. 438/424, 427, 438/428, 435, 437, 433, 692; 148/DIG. 50

[56] References Cited

U.S. PATENT DOCUMENTS

| | | | |
|---|---|---|---|
| 5,459,096 | 10/1995 | Venkatesan et al. | 438/427 |
| 5,578,519 | 11/1996 | Cho | 438/424 |
| 5,736,462 | 4/1998 | Takahashi et al. | 438/424 |

*Primary Examiner*—Trung Dang
*Attorney, Agent, or Firm*—Proskauer Rose LLP

[57] ABSTRACT

A method for improving the planarity of a semiconductor chip using chemical-mechanical polishing during a shallow trench isolation process is described. Specifically, an polish-stop layer, preferably of silicon nitride, is formed over a semiconductor wafer (or optionally formed over a pad oxide layer formed on the wafer). A cap layer, preferably of polysilicon, is then formed over the polish-stop layer. The active regions of the chip are defined, preferably using a photoresist mask by photolithography. The wafer, polish-stop and cap layers are then etched, between the active regions, to form shallow trenches. A lining dielectric layer, preferably an oxide, is formed over the etched and non-etched regions to fill the shallow trenches for isolation purposes. The dielectric layer has an etching rate at least three times greater than the etching rate of cap layer. When polysilicon is selected as the cap layer and oxide is selected as the dielectric layer, the selectivity rate is greater than ten. However, the conventional oxide dielectric/nitride layer etching selectivity rate is less than three. Accordingly, the present invention provides a far greater etching selectivity rate than the prior art. In addition, the polish rate of the cap layer is much higher that that of the polish-stop layer. Therefore, the cap layer can be easily removed which reduces the CMP time while minimizing the dishing effect.

12 Claims, 4 Drawing Sheets

METHOD FOR IMPROVING THE PLANARITY OF SHALLOW TRENCH ISOLATION

FIELD OF THE INVENTION

The invention relates generally to shallow trench isolation (STI) processes, and, more particularly, to a method of improving the planarity of the surface of a semiconductor device during STI processes using chemical mechanical polishing (CMP) techniques by forming a thin cap layer between the polish-stop and the lining dielectric layers.

BACKGROUND OF THE INVENTION

As is known, isolation between multiple devices on a single semiconductor chip is one of the most important issues during fabrication. This is especially true as device dimensions decrease using sub-half and sub-quarter micron processes which allow an increase in device density on the chip real estate.

One common technique for isolation is known as local oxidation of silicon (LOCOS). In this technique, a window is opened between devices which allows oxygen to react with the silicon exposed under the window. The result is a "bowl" shaped oxide having a "bird's beak" at both sides to isolate devices on either side of the LOCOS oxide. However, do the resulting "bird's beak" and bowl shaped oxide, LOCOS is not practical (i.e. too large) for use in sub-half and sub-quarter micron fabrication processes.

Therefore, a newer technique known as shallow trench isolation (STI) has been developed to isolate such small dimension devices beyond 0.25 μm. A conventional STI process is illustrated in FIGS. 1A–1C. In brief, a pad oxide layer 30 is grown on a silicon wafer 5. A silicon nitride layer 25 is then deposited on pad oxide layer 30 and acts as an polish-stop layer in subsequent CMP. As shown in FIG. 1A, photoresist 20 is patterned, e.g. by photolithography, over the selected active regions 15. The polish-stop and pad oxide layers 25, 30 are then etched between photoresist 20. Shallow trenches 10, 35 are then etched into wafer 5.

FIG. 1B shows a trench filling oxide dielectric layer 40 lining the chip surface. Note that a step 45 forms between the dense active areas 15 and the open area 35. This step forms the so-called "dishing" effect which occurs after CMP. FIG. 1C shows the chip after CMP having the dishing effect. Chemical-mechanical polishing may be performed using conventional slurry techniques, and the like. CMP serves a dual function; the first is planarizing the chip (although the dishing effect remains) and the second is to remove the oxide dielectric layer from the nitride polish-stop layer over active areas 15. As stated, nitride layer 25 acts as the polish-stop during the CMP step.

To reduce the dishing effect caused by CMP, a prior art technique using reverse-tone etch-back is known. This technique is illustrated in FIGS. 2A–2C. Reverse-tone mask 50, which has the opposite pattern as photoresist mask 20 of FIG. 1A, is formed between the active areas of the chip, as shown in FIG. 2A. Next, the oxide dielectric layer is etched away from the nitride polish-stop layer 25. However, due to the low etching selectivity rate between the oxide dielectric layer and the nitride layer (less than three), removing the oxide from the nitride is difficult at best. This is illustrated in FIG. 2B, showing a portion of the nitride polish-stop layer 25 etched away. To prevent the etching away of nitride layer 25, an alternative is to halt etching prior to reaching nitride layer 25, as shown in FIG. 2C. However, leaving a portion of the oxide on nitride layer 25 creates process control instability. Accordingly, neither scenario of FIGS. 2B or 2C is acceptable.

It is therefore an object of the present invention to improve the planarity of the chip using CMP during STI processes.

Another object of the present invention is to improve the etching selectivity rate between the nitride polish-stop layer and the overlaying oxide dielectric.

Various other objects, advantages and features of the present invention will become readily apparent from the ensuing detailed description and the novel features which will be particularly pointed out in the appended claims.

SUMMARY OF THE INVENTION

These and other objectives are realized by a method for improving the planarity of a semiconductor chip using chemical-mechanical polishing during a shallow trench isolation process. Specifically, an polish-stop layer, preferably of silicon nitride, is formed over a semiconductor wafer (or optionally formed over a pad oxide layer formed on the wafer). A cap layer, preferably of polysilicon, is then formed over the polish-stop layer. The active regions of the chip are defined, preferably using a photoresist mask by photolithography. The wafer, polish-stop and cap layers are then etched, between the active regions, to form shallow trenches. A lining dielectric layer, preferably an oxide, is formed over the etched and non-etched regions to fill the shallow trenches for isolation purposes. The dielectric layer has an etching rate at least three times greater than the etching rate of cap layer. When polysilicon is selected as the cap layer and oxide is selected as the dielectric layer, the selectivity rate is greater than ten. In contrast, the conventional oxide dielectric/nitride layer etching selectivity rate is less than three. Accordingly, the present invention provides a far greater etching selectivity rate than the prior art.

Further, the polish rate of the cap layer is much higher that that of the polish-stop layer. Therefore, the cap layer can be easily removed which reduces the CMP time while minimizing the dishing effect.

In addition, photoresist regions may be formed by, e.g., reverse-tone photolithography over the etched regions. The dielectric layer is then etched through the exposed regions to the cap layer. As stated above, this etching step is easily performed due to the high etching selectivity rate of the present invention. The photoresist is then removed. Finally, the surface is planarized by chemical mechanical polishing (CMP). During CMP, the top surface of the chip is polished, preferably using a silica-based slurry, until the polish-stop layer is reached, so that the cap layer and top portions of the dielectric layer are removed. Accordingly, the remaining nitride layer and oxide filled shallow trenches are substantially planar.

BRIEF DESCRIPTION OF THE DRAWINGS

The following detailed description, given by way of example and not intended to limit the present invention solely thereto, will best be understood in conjunction with the accompanying drawings in which.

DETAILED DESCRIPTION OF THE PRESENT INVENTION

To overcome the difficulties in the prior art, i.e. to increase the etching selectivity rate when etching away the oxide dielectric after reverse-tone masking, an extra layer is added prior to the formation of the shallow trenches. Specifically, the inventive method will be described with reference to the flow chart of FIG. 4 and the illustrations of FIGS. 3A and 3B.

Figure 1A:
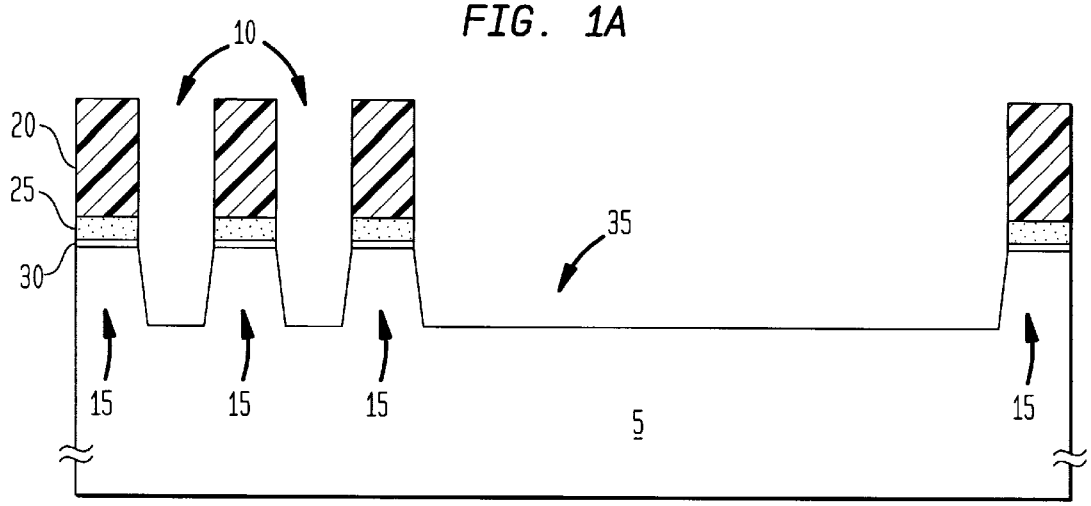
FIGS. 1A–1C illustrate a conventional STI fabrication using CMP.
Figure 1B:
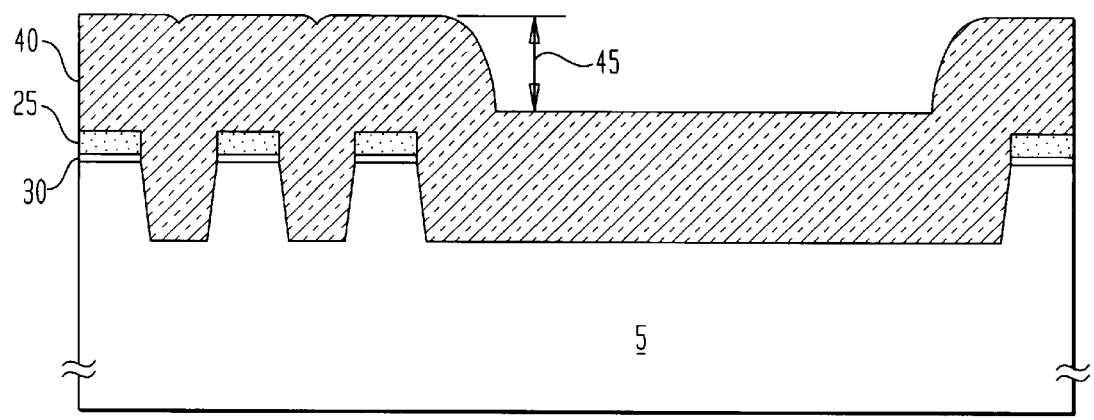
Figure 1C:
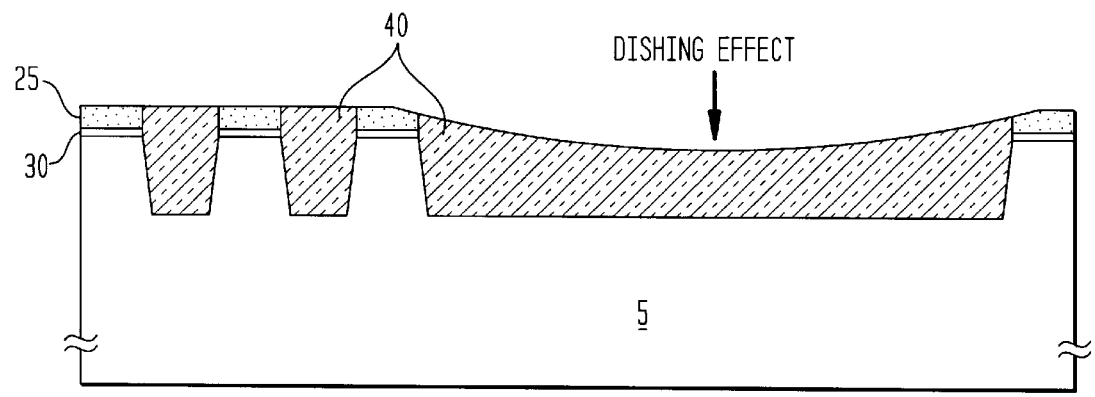

Steps 100, 110, 130, 140, 150 and 160 are essentially similar to the conventional STI process shown in FIG. 1A and 1B (except for the addition of a cap layer, discussed below). In particular, in step 100, a pad oxide layer of approximately 150–300 Å is grown over the wafer. In step 110, an polish-stop layer, preferably formed of silicon nitride, of approximately 1500–3000 Å is deposited over the pad oxide layer. The polish-stop layer is the stop layer for the subsequent CMP (step 190).

As will be discussed in greater detail below, a cap layer, preferably formed of polysilicon, of approximately 400–1000 Å is then deposited over the polish-stop layer to increase the etching selectivity rate between a lining oxide dielectric layer (to be deposited later) and the cap layer, in step 120. In step 130, the active areas of the chip are defined by photolithography masking. Thereafter, in step 140, the cap, polish-stop and pad oxide layers are etched through the mask to open the active regions. Next, in step 150, shallow trenches of approximately 3000–7000 Å are etched in the wafer and, in step 160, the trenches are filled with a lining dielectric layer, preferably oxide, of approximately 6000–12000 Å.

Figure 2A:
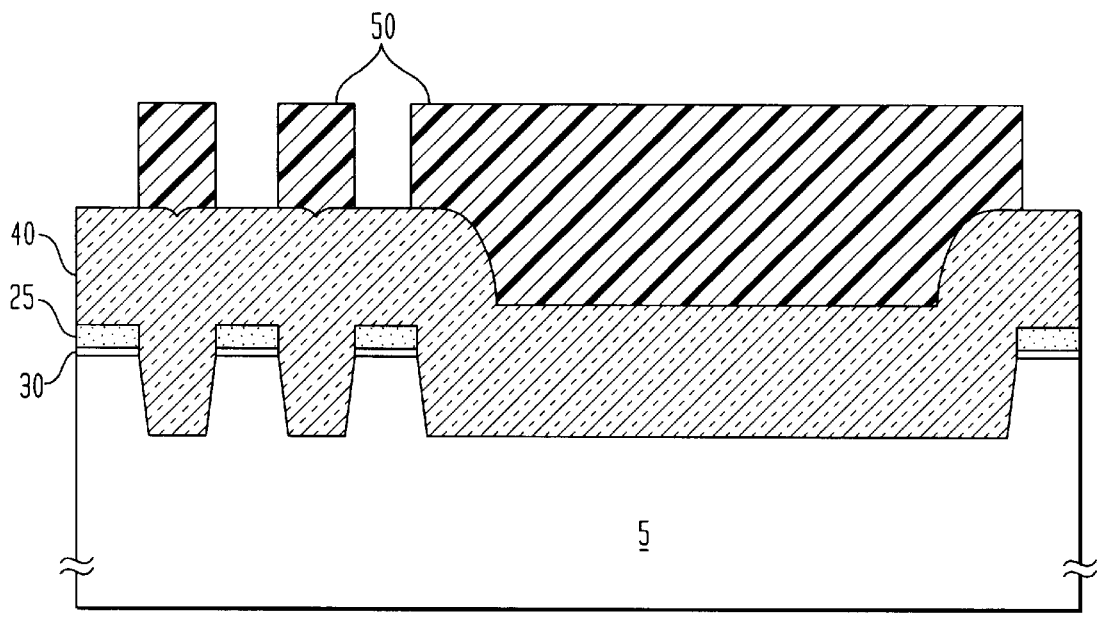
FIGS. 2A–2C illustrate a conventional STI fabrication using CMP and reverse-tone masking.
Figure 2B:
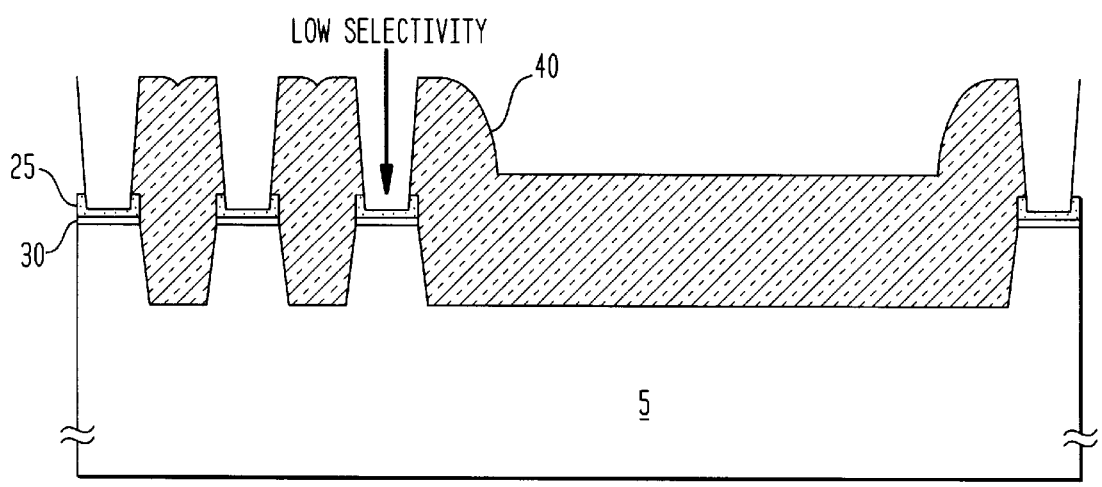
Figure 2C:
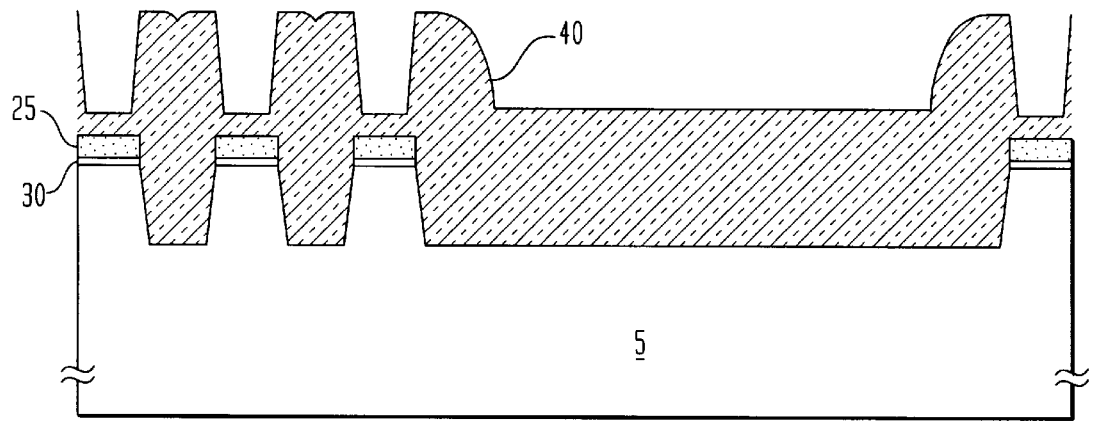
Figure 3A:
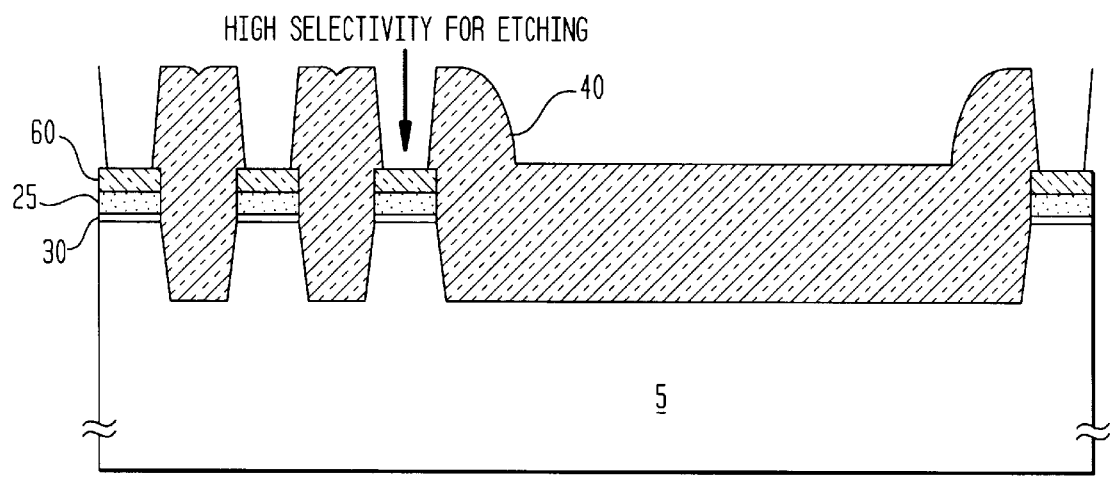
FIGS. 3A–3B illustrate the improved planarizing technique in accordance with the present invention.
Figure 3B:
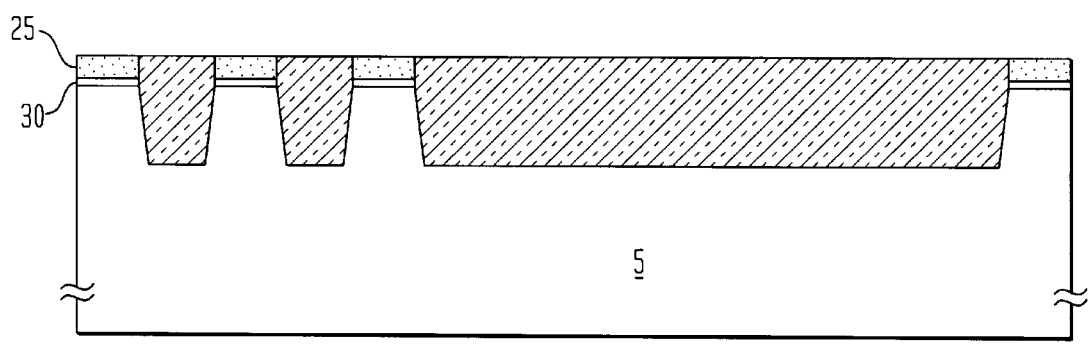
Figure 4:
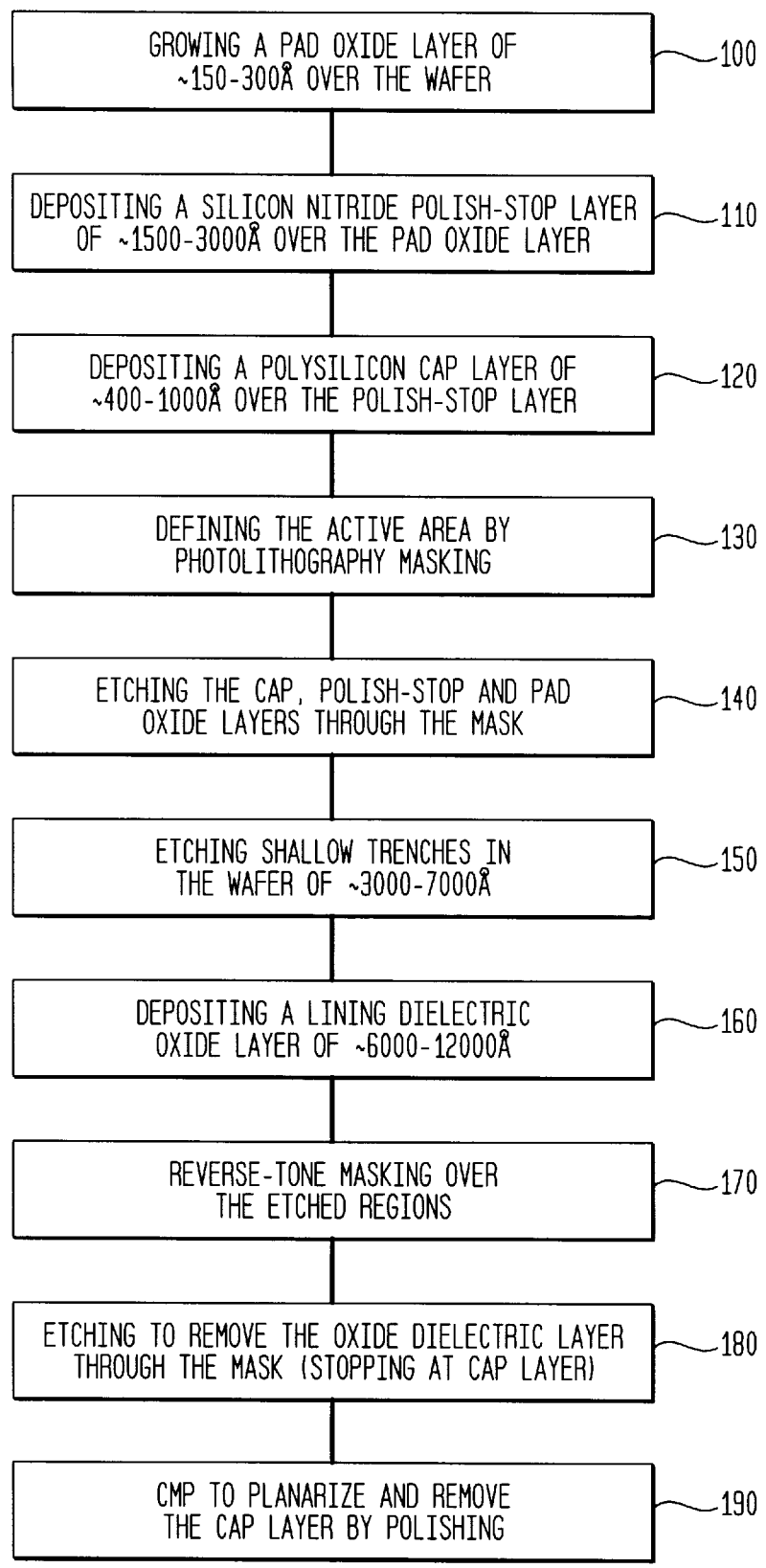
FIG. 4 is a flow chart showing the illustrative steps for performing the method of FIGS. 3A–3B in accordance with the present invention.

Similar to FIG. 2A, in step 170, a reverse-tone mask is formed by, e.g., photolithography, over the etched regions in a manner opposite to the masking in step 130. In step 180, the oxide dielectric layer is etched through the reverse-tone mask until the polysilicon cap layer is reached. This is shown in FIG. 3A. This etching step is performed accurately due to the relatively high etching selectivity rate (greater than ten) between the oxide dielectric layer and the polysilicon cap layer. Conventionally, an etching selectivity rate of less than three occurs when etching the oxide dielectric layer from the nitride polish-stop layer. As can be plainly seen, the addition of the cap layer greatly improves the selectivity rate. Of course, polysilicon is not the only material that can be used as the cap layer. The only requirements are that it has a higher etching rate than the polish-stop layer (as is conventional) and the dielectric layer. Further, it is desirable that the cap layer have a CMP polishing rate greater than that of the polish-stop layer (whether or not the polish-stop layer is chosen to be silicon nitride).

In step 180 and as shown in FIG. 3A, the oxide dielectric layer is etched (through the mask, not shown) stopping at the cap layer. Finally, at step 190, the top surface of the chip is planarized by CMP, in which the cap layer is removed. As previously mention, the material of the cap layer, e.g. polysilicon, is selected so that it has a higher CMP polishing rate that the nitride polish-stop layer. In addition, the polish rate of the cap layer is much higher that that of the polish-stop layer. Therefore, the cap layer can be easily removed which reduces the CMP time while minimizing the dishing effect.

While an illustrative embodiment has been chosen to show the invention, it will be readily understood by those skilled in the art that various changes and modifications can be made herein without departing from the scope or spirit of the invention as described in the appended claims.

What is claimed is:

1. A method for fabricating a semiconductor device using shallow trench isolation, comprising the steps of:

forming an polish-stop layer over a semiconductor wafer;

forming a cap layer over said polish-stop layer;

defining active regions of said device;

etching said wafer, polish-stop and cap layers, between the active regions, to form shallow trenches;

forming a lining dielectric layer over the etched and non-etched regions, wherein said dielectric and cap layers being such that the etching rate of said dielectric layer is at least three times greater than the etching rate of said cap layer;

forming photoresist regions by reverse-tone photolithography over said etched regions;

etching said dielectric layer through the exposed regions to said cap layer; and removing said photoresist regions.

2. The method of claim 1, further comprising the step of planarizing said dielectric layer by chemical mechanical polishing (CMP).

3. The method of claim 2, wherein said step of planarizing by CMP polishes the top surface of the device until said polish-stop layer is reached, such that said cap layer and top portions of said dielectric layer are removed.

4. The method of claim 3, wherein said step of planarizing by CMP uses a silica-base slurry.

5. The method of claim 4, wherein said step of defining active regions is performed by photolithography.

6. The method of claim 4, further comprising the step of forming a pad oxide layer between said semiconductor wafer and said polish-stop layer.

7. The method of claim 1, wherein said cap layer is polysilicon.

8. The method of claim 7, wherein said dielectric layer is a lining oxide, such that the etching rate of said lining oxide divided by said polysilicon is greater than ten, and the polishing rate of said polysilicon is greater than that of said polish-stop layer.

9. The method of claim 8, wherein said polysilicon cap layer is approximately 400 to 1000 Å thick.

10. The method of claim 9, wherein said polish-stop layer being silicon nitride.

11. The method of claim 10, wherein said pad oxide layer is approximately 150 to 1000 Å thick, said nitride polish-stop layer is approximately 1500 to 3000 Å thick, and said lining oxide dielectric layer is approximately 6000 to 12000 Å thick.

12. The method of claim 11, wherein said shallow trenches formed by said step of etching are approximately 3000 to 7000 Å thick.

* * * * *